US010778220B2

(12) United States Patent
Hwang et al.

(10) Patent No.: US 10,778,220 B2
(45) Date of Patent: Sep. 15, 2020

(54) DATA OUTPUT BUFFER

(71) Applicant: SK hynix Inc., Gyeonggi-do (KR)

(72) Inventors: Jin Ha Hwang, Gyeonggi-do (KR);
Keun Seon Ahn, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/284,758

(22) Filed: Feb. 25, 2019

(65) Prior Publication Data

US 2020/0028507 A1 Jan. 23, 2020

(30) Foreign Application Priority Data

Jul. 17, 2018 (KR) .................. 10-2018-0083137

(51) Int. Cl.
*H03K 17/68* (2006.01)
*H03K 17/687* (2006.01)
*G11C 7/10* (2006.01)
*H03K 3/037* (2006.01)

(52) U.S. Cl.
CPC ....... *H03K 17/6872* (2013.01); *G11C 7/1057* (2013.01); *H03K 3/037* (2013.01); *G11C 2207/2254* (2013.01)

(58) Field of Classification Search
None
See application file for complete search history.

(56) References Cited

U.S. PATENT DOCUMENTS 9,397,868 B1 * 7/2016 Hossain ............ H04L 25/03057
9,653,147 B1 * 5/2017 Wang ................... H04L 25/028
9,948,300 B1 * 4/2018 Greeff ................. H03K 5/1534
RE47,312 E  * 3/2019 Moon ................. H04L 25/0298
2002/0030517 A1 * 3/2002 Kurisu ........... H03K 19/018585
　　　　　　　　　　　　　　　　　　　327/108
2010/0301905 A1 * 12/2010 Kanda ............... H04L 25/03878
　　　　　　　　　　　　　　　　　　　327/109
2013/0070507 A1 * 3/2013 Yoon ........................ G11C 5/02
　　　　　　　　　　　　　　　　　　　365/51
2013/0099823 A1 * 4/2013 Moon .................. H04L 25/028
　　　　　　　　　　　　　　　　　　　326/87

(Continued)

FOREIGN PATENT DOCUMENTS

KR　　1020040092416　　11/2004

OTHER PUBLICATIONS

Fei Yuan, CMOS Active Inductors and Transformers: Principle, Implementation, and Applications 2008th Edition Jun. 17, 2008.

(Continued)

*Primary Examiner* — Lincoln D Donovan
*Assistant Examiner* — Khareem E Almo
(74) *Attorney, Agent, or Firm* — IP & T Group LLP

(57) ABSTRACT

A data output buffer includes a pull-up main driver outputting output data having a high level through an output pad by performing an emphasis operation according to input data, a pull-down main driver outputting the output data having a low level through the output terminal according to the input data, an active inductor controller selectively outputting an inductor activating voltage by detecting a rising or falling period of the input data, and an active inductor selectively performing a de-emphasis operation on the output terminal in response to the inductor activating voltage.

19 Claims, 9 Drawing Sheets

(56) References Cited

U.S. PATENT DOCUMENTS

2017/0264283 A1\* 9/2017 Tan ..................... H03K 17/162
2018/0123593 A1\* 5/2018 Choi .................... G11C 29/022

OTHER PUBLICATIONS

Jeongsik Yoo et al., "A Low-Power Post-LPDDR4 Interface Using AC Termination at RX and an Active Inductor at TX", IEEE Transactions on Circuits and Systems, vol. 65, No. 6, pp. 789-793, Jun. 2018.

\* cited by examiner

DATA OUTPUT BUFFER

CROSS-REFERENCE TO RELATED APPLICATION

The present application claims priority under 35 U.S.C. § 119(a) to Korean patent application number 10-2018-0083137, filed on Jul. 17, 2018, which is incorporated herein by reference in its entirety.

BACKGROUND

Field of Invention

Various embodiments relate to a data output buffer, and more particularly, to a data output buffer using an active inductor.

Description of Related Art

A memory device may store data or output the stored data. For example, the memory device may include a volatile memory device that loses stored data when power supply is blocked, or a non-volatile memory device that retains stored data even when power supply is blocked. The memory device may include a memory cell array storing data, a peripheral circuit performing various operations including program, read and erase operations, and a control logic controlling the peripheral circuit.

A memory controller may control data communication between a host and a memory device.

The memory device may communicate with the memory controller through a channel. For example, a data output buffer, which may be part of the peripheral circuit in the memory device, may output data read from the memory device through the channel.

SUMMARY

Various embodiments are directed to a data output buffer capable of selectively performing an emphasis function or a de-emphasis function by selectively driving an active inductor during transition periods of data.

In accordance with an embodiment, a data output buffer may include a pull-up main driver outputting output data having a high level through an output pad by performing an emphasis operation according to input data, a pull-down main driver outputting the output data having a low level through the output terminal according to the input data, an active inductor controller selectively outputting an inductor activating voltage by detecting a rising or falling period of the input data, and an active inductor selectively performing a de-emphasis operation on the output terminal in response to the inductor activating voltage.

In accordance with an embodiment, a data output buffer may include a pull-up pre-driver outputting a pull-up code by calibrating a pull-up pulse, a pull-down pre-driver outputting a pull-down code by calibrating a pull-down pulse, an active inductor controller selectively outputting an inductor activating voltage by detecting the pull-up code and the pull-down pulse and detecting the pull-down code and the pull-up pulse, and an active inductor selectively performing a de-emphasis operation to reduce a potential of an output terminal in response to the inductor activating voltage.

In accordance with an embodiment, a data output buffer may include a pull-up pre-driver suitable for receiving a first pull-up signal corresponding to input data and pre-driving the first pull-up signal to output a second pull-up signal, a pull-down pre-driver suitable for receiving a first pull-down signal corresponding to the input data and pre-driving the first pull-down signal to output a second pull-down signal, a pull-up main driver suitable for receiving the second pull-up signal and driving the second pull-up signal to output a pull-up output signal through an output pad, a pull-down main driver suitable for receiving the second pull-down signal and driving the second pull-down signal to output a pull-down output signal through the output pad, a detector suitable for detecting transition periods of the input data to generate a detection signal, and an active inductor, coupled to the output pad, suitable for selectively performing emphasis and de-emphasis for the pull-up and pull-down output signals during the transition periods based on the detection signal.

DETAILED DESCRIPTION

Various embodiments will now be described more fully with reference to the accompanying drawings. However, elements and features of the present invention may be configured or arranged differently than disclosed herein. Thus, the present invention is not limited to the embodiments set forth herein. Rather, these embodiments are provided so that this disclosure is thorough and complete and fully conveys the scope of the embodiments to those skilled in the art. It is noted that, throughout the specification, reference to "an embodiment" or the like is not necessarily to only one embodiment, and different references to any such phrase are not necessarily to the same embodiment(s).

It will be understood that when an element is referred to as being "coupled" or "connected" to a certain element, it may be directly coupled or connected to the certain element or may be indirectly coupled or connected to the certain element, with intervening elements being present therebetween. Communication between two elements, whether directly or indirectly coupled/connected, may wired or wireless, unless stated or the context indicates otherwise. In the specification, when an element is referred to as "comprising" or "including" a component, such open-ended transition phrase does not exclude one or more other components but may further include other component(s), unless the context indicates otherwise.

Figure 1:
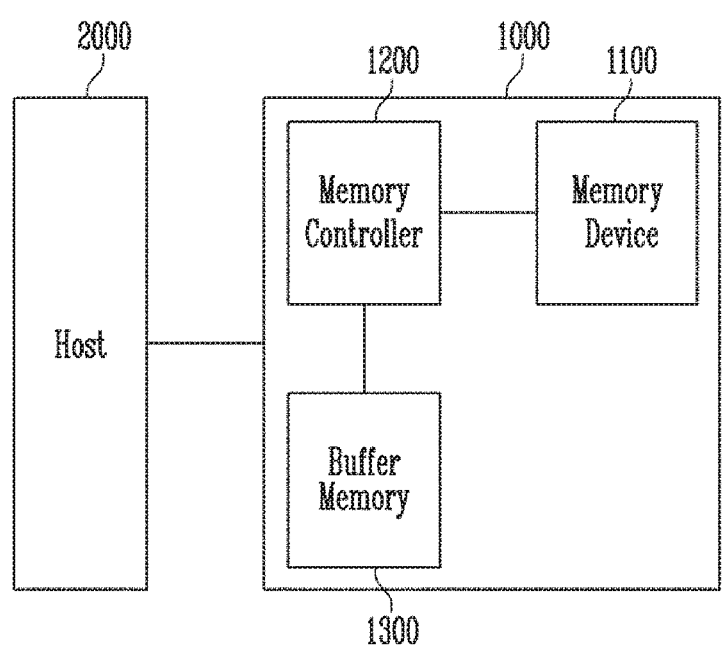
FIG. 1 is a diagram illustrating a memory system.

FIG. 1 is a diagram illustrating a memory system 1000.

Referring to FIG. 1, the memory system 1000 may store data, or output or delete the stored data in response to a request of a host 2000.

The memory system 1000 may include a memory device 1100 storing data, a memory controller 1200 and a buffer memory 1300. The buffer memory 1300 may temporarily store data necessary for operations of the memory system 1000. The memory controller 1200 may control the memory device 1100 and the buffer memory 1300 in response to control of the host 2000.

The host 2000 may communicate with the memory system 1000 using at least one of various communication methods such as universal serial bus (USB), serial AT attachment (SATA), serial attached SCSI (SAS), high speed interchip (HSIC), small computer system interface (SCSI), peripheral component interconnection (PCI), PCI express (PCIe), nonvolatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

The memory device 1100 may include a volatile memory device that loses stored data when power supply is blocked, or a non-volatile memory device that retains stored data even when power supply is blocked. The memory controller 1200 may control the memory device 1100 to perform a program, read, or erase operation. For example, during a program operation, the memory device 1100 may receive a command, an address, and data from the memory controller 1200 and perform the program operation. During a read operation, the memory device 1100 may receive a command and an address from the memory controller 1200 and output read data to the memory controller 1200. The memory device 1100 may include an input/output circuit for inputting and outputting data.

The memory controller 1200 may control the general operations of the memory system 1000 and control data exchange between the host 2000 and the memory device 1100. For example, the memory controller 1200 may control the memory device 1100 to program, read or erase data in response to a request from the host 2000. In addition, the memory controller 1200 may receive data and a logical address from the host 2000 and convert (or translate) the logical address into a physical address indicating a region where the data is actually stored. In addition, the memory controller 1200 may store a logical-to-physical address mapping table configuring a mapping relationship between the logical address and the physical address in the buffer memory 1300.

The buffer memory 1300 may serve as an operation memory or a cache memory of the memory controller 1200 and store system data used in the memory system 1000 in addition to the above information. In accordance with an embodiment, the buffer memory 1300 may include double data rate synchronous dynamic random access memory (DDR SDRAM), low power double data 4 (LPDDR4) SDRAM, graphics double data rate (GDDR) SDRAM, low power DDR (LPDDR), or Rambus dynamic random access memory (RDRAM).

Figure 2:
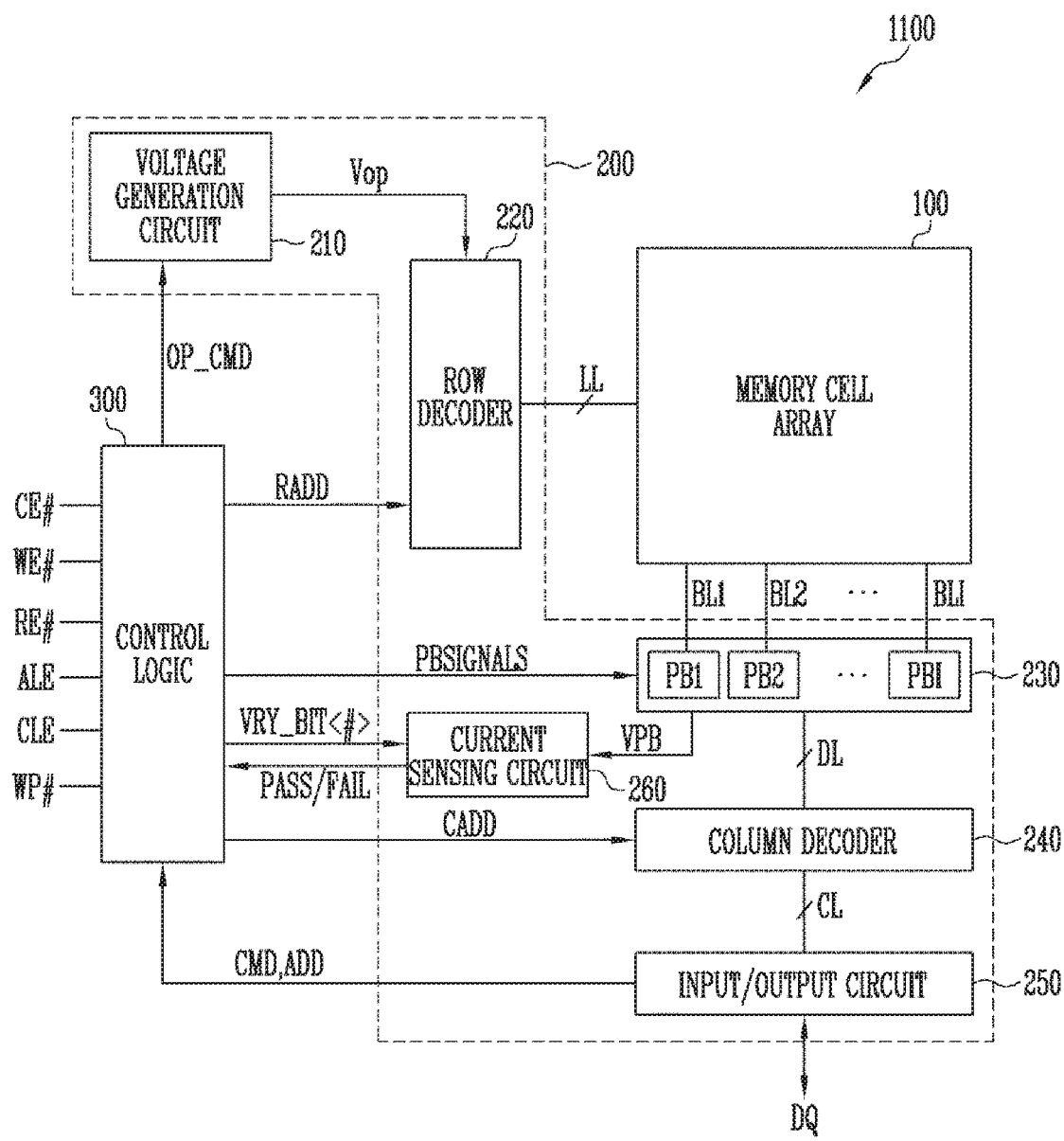
FIG. 2 is a diagram illustrating a memory device, such as that of FIG. 1.

FIG. 2 is a diagram illustrating the memory device 1100 of FIG. 1.

Referring to FIG. 2, the memory device 1100 may be a volatile memory device or a non-volatile memory device. Although FIG. 2 shows a non-volatile memory device as an embodiment, the present invention is not limited thereto.

The memory device 1100 may include a memory cell array 100 which stores data. The memory device 1100 may include a peripheral circuit 200 configured to perform a program operation to store data in the memory cell array 100, a read operation to output the stored data, and an erase operation to erase the stored data. The peripheral circuit 200 may include other components, as shown in FIG. 2 and described below. The memory device 1100 may include a control logic 300 configured to control the peripheral circuit 200 in response to control of the memory controller 1200 shown in FIG. 1.

The memory cell array 100 may include a plurality of memory blocks. The memory blocks may store user data and various types of information for performing the operations of the memory device 100. The memory blocks may have a two-dimensional or three-dimensional structure. To improve integration density, three-dimensionally structured memory blocks have been used mainly. Two-dimensional memory blocks may have memory cells arranged in parallel with a substrate. Three-dimensional memory blocks may include memory cells stacked in a vertical direction to the substrate.

The control logic 300 may control the peripheral circuit 200 to perform program, read and erase operations. For example, the peripheral circuit 200 may include a voltage generation circuit 210, a row decoder 220, a page buffer group 230, a column decoder 240, an input/output circuit 250, and a current sensing circuit 260.

The voltage generation circuit 210 may generate various operating voltages Vop applied to perform program, read and erase operations in response to an operation code OP_CMD received from the control logic 300. For example, the control logic 300 may control the voltage generation circuit 210 to generate various voltages including a program voltage, a verify voltage, a pass voltage, a read voltage, an erase voltage and a turn-on voltage.

The row decoder 220 may transfer the operating voltages Vop to local lines LL coupled to a selected memory block, among the memory blocks of the memory cell array 100, in response to a row address RADD. The local lines LL may include local word lines, local drain select lines, and local source select lines. In addition, the local lines LL may include various lines coupled to a memory block, such as a source line.

The page buffer group 230 may be coupled to bit lines BL1 to BLI coupled to the memory blocks of the memory cell array 100. The page buffer group 230 may include a plurality of page buffers PB1 to PBI coupled to the bit lines BL1 to BLI, respectively. The page buffers PB1 to PBI may operate in response to page buffer control signals PBSIGNALS. For example, the page buffers PB1 to PBI may temporarily store data received through the bit lines BL1 to BLI, or sense voltages or currents in the bit lines BL1 to BLI during a read or verify operation.

The column decoder 240 may transfer data between the input/output circuit 250 and the page buffer group 230 in response to a column address CADD. For example, the column decoder 240 may exchange data with the page buffers PB1 to PBI through data lines DL, or exchange data with the input/output circuit 250 through column lines CL.

The input/output circuit 250 may receive a command CMD, an address ADD, and data from an external device (e.g., the memory controller 1200 shown in FIG. 2) through an input/output pad DQ or terminal. The input/output circuit 250 may output the read data to the memory controller 1200 through the input/output pad DQ. For example, the input/output circuit 250 may transfer the command CMD and the address ADD from the memory controller 1200 to the control logic 300, or may exchange data DATA with the column decoder 240.

The current sensing circuit 260 may generate a reference current in response to an allowable bit VRY_BIT<#>. The current sensing circuit 260 may compare a sensing voltage VPB received from the page buffer group 230 with a reference voltage generated by the reference current to output a pass signal PASS or a fail signal FAIL during a read operation or a verify operation.

The control logic 300 may receive the command CMD and the address ADD in response to signals received through pads CE #, WE #, RE #, ALE, CLE and WP #. The control logic 300 may output the operation signal OP_CMD, the row address RADD, the page buffer control signals PBSIGNALS and the allowable bit VRY_BIT<#> to control the peripheral circuit 200 in response to the command CMD and the address ADD. The control logic 300 may determine whether a verify operation passes or fails in response to the pass or fail signal PASS or FAIL.

Figure 3:
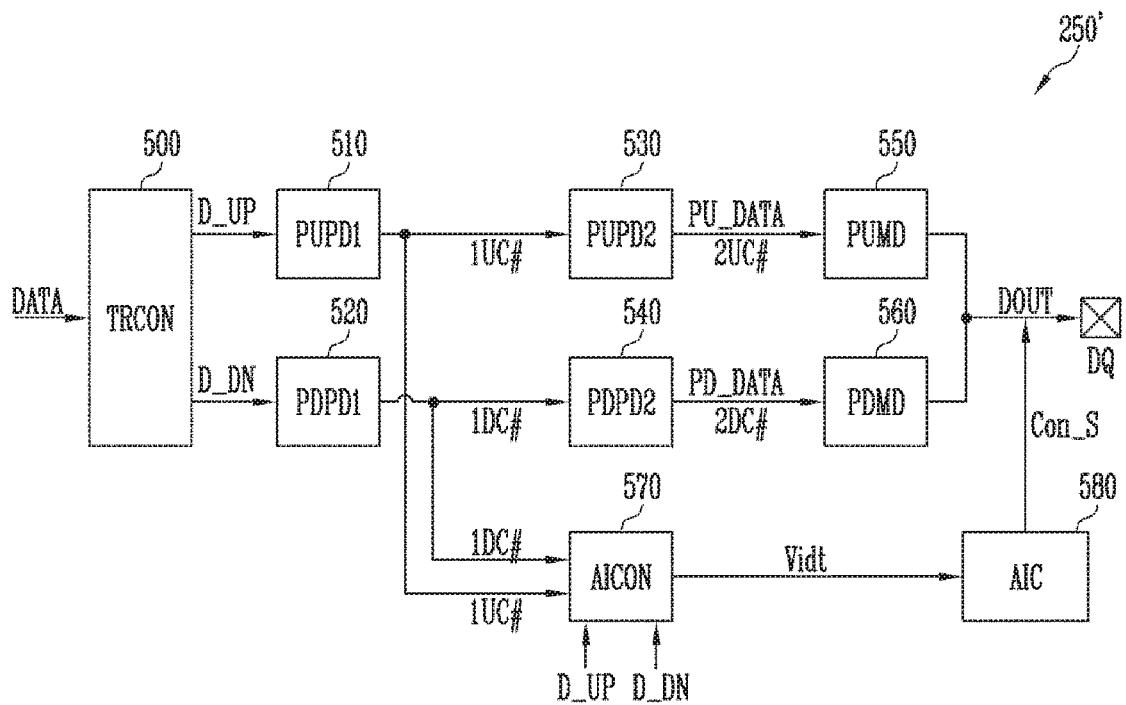
FIG. 3 is a diagram illustrating a data output buffer in accordance with an embodiment.

FIG. 3 is a diagram illustrating a data output buffer 250' in accordance with an embodiment.

Referring to FIG. 3, the data output buffer 250' may be included in the input/output circuit 250 of FIG. 2. For example, the data output buffer 250' may amplify data DATA received through the column lines CL as shown in FIG. 2 and output output data DOUT through the input/output pad DQ. The data output buffer 250' may include a trigger controller (TRCON) 500, a first pull-up pre-driver (PUPD1) 510, a first pull-down pre-driver (PDPD1) 520, a second pull-up pre-driver (PUPD2) 530, a second pull-down pre-driver (PDPD2) 540, a pull-up main driver 550, a pull-down main driver 560, an active 15 inductor controller (AICON) 570, and an active inductor (AIC) 580.

The trigger controller 500 may receive the data DATA from the column lines CL as shown in FIG. 2 and output a pull-up pulse D_UP and a pull-down pulse D_DN according to the received data DATA. The pull-up pulse D_UP may be a signal having a logic high level (or a high level) and a pull-down pulse D_DN may be a signal having a logic low level (or a low level).

The first pull-up pre-driver 510 may output a first pull-up code 1UC # including pull-up data in response to the pull-up pulse D_UP. For example, the first pull-up pre-driver 510 may calibrate the pull-up pulse D_UP to output the first pull-up code 1UC #. The first pull-up code 1UC # may include a plurality of bits and include a pull-up signal having the same level as the pull-up pulse D_UP. For example, the first pull-up code 1UC # may include a plurality of bits, and one of the bits may be a pull-up signal, and the other bits may be calibration codes. The first pull-up pre-driver 510 may include an off-chip driver (OCD) and an on-die termination (ODT) circuit, or one of them. For example, the off-chip driver (OCD) may output the first pull-up code 1UC # including a plurality of bits according to a level of the pull-up pulse D_UP. The on-die termination (ODT) circuit may control resistance of lines or pins through which the first pull-up code 1UC # is output at a set level, which may be predetermined.

The first pull-down pre-driver 520 may output a first pull-down code 1DC # in response to the pull-down pulse D_DN. For example, the first pull-down pre-driver 520 may calibrate the pull-down pulse D_DN to output the first pull-down code 1DC #. The first pull-down code 1DC # may include a plurality of bits and include a pull-down signal having the same level as the pull-down pulse D_DN. For example, the first pull-down code 1DC # may include a plurality of bits, and one of the bits may be a pull-down signal, and the other bits may be calibration codes. For example, the first pull-down pre-driver 520 may output the first pull-down code 1DC # including the plurality of bits by calibrating the pull-down pulse D_DN. The first pull-down pre-driver 520 may include an off-chip driver (OCD) and an on-die termination (ODT) circuit, or may include of them. For example, the off-chip driver (OCD) may output the first pull-down code 1DC # including a plurality of bits according to a level of the pull-down pulse D_DN. The on-die termination (ODT) circuit may control resistance of lines or pins through which the first pull-down code 1DC # is output at a set level, which may be predetermined.

The second pull-up pre-driver 530 may output pull-up data PU_DATA and a second pull-up code 2UC # in response to the first pull-up code 1UC #. The pull-up data PU_DATA may determine a high level of the output data DOUT. The pull-up data PU_DATA may be output as inverted data of a pull-up signal from the first pull-up pre-driver 510 and may have a swing width of the received pull-up signal. For example, the second pull-up pre-driver 530 may output the pull-up data PU_DATA having a low level when the received data DATA has a high level, and may output the pull-up data PU_DATA having a high level when the received data DATA has a low level. The second pull-up code 2UC # may be generated by calibrating the calibration code included in the received first pull-up code 1UC #. In other words, the second pull-up pre-driver 530 may output the second pull-up code 2UC # by correcting a level of the calibration code included in the first pull-up code 1UC # according to a set signal strength, which may be predetermined. In various embodiments, although the first pull-up code 1UC # and the second pull-up code 2UC # have different signal strengths (or gains), the first and second pull-up codes 1UC # and 2UC # may include the same data.

The second pull-down pre-driver 540 may output pull-down data PD_DATA and a second pull-down code 2DC # in response to the first pull-down code 1DC #. The pull-down data PD_DATA may determine a low level of the output data DOUT. The pull-down data PD_DATA may be output as inverted data of a pull-down signal from the first pull-down pre-driver 520 and may have a swing width of the received pull-down signal. For example, the second pull-down pre-driver 540 may output the pull-down data PD_DATA having a low level when the received data DATA has a high level, and may output the pull-down data PD_DATA having a high level when the received data DATA has a low level. The second pull-down code 2DC # may be generated by calibrating the calibration code included in the received first pull-down code 1DC #. In other words, the second pull-down pre-driver 540 may output the second pull-down code 2DC # by correcting a level of the calibration code included in the first pull-down code 1DC # according to a set signal strength, which may be predetermined. In various embodiments, although the first pull-down code 1DC # and the second pull-down code 2DC # have different signal strengths, the first and second pull-down codes 1UC # and 2UC # may include the same data.

The pull-up main driver 550 may output high-level data as the output data DOUT to the input/output pad DQ in response to the pull-up data PU_DATA and the second pull-up code 2UC #. The pull-up main driver 550 may output the output data DOUT having a high level to the input/output pad DQ when receiving the pull-up data PU_DATA having a low level. The pull-up main driver 550 may not output the output data DOUT when receiving the pull-up data PU_DATA having a high level. In other words, when the pull-up main driver 550 does not output the output data DOUT, an output node of the pull-up main driver 550 may be floated.

The pull-down main driver 560 may output low-level data as the output data DOUT to the input/output pad DQ in response to the pull-down data PD_DATA and the second pull-down code 2DC #. The pull-down main driver 560 may output the output data DOUT having a low level to the input/output pad DQ when receiving the pull-down data PD_DATA having a high level. The pull-down main driver 560 may not output the output data DOUT when receiving the pull-down data PD_DATA having a low level. In other words, when the pull-down main driver 560 does not output the output data DOUT, an output node of the pull-down main driver 560 may be floated.

The active inductor controller 570 may selectively output an inductor activating voltage Vidt by detecting a period in which the data DATA is pulled up or down. In other words, the active inductor controller 570 may detect transition periods (e.g., rising and falling periods or edges) of the data DATA to generate the inductor activating voltage Vidt as the detection signal. The active inductor controller 570 may selectively output the inductor activating voltage Vidt in response to the first pull-up code 1UC #, the first pull-down code 1DC #, the pull-up pulse D_UP, and the pull-down pulse D_DN. For example, the active inductor controller 570 may output the inductor activating voltage Vidt during a falling period of the data DATA and may not output the inductor activating voltage Vidt during a rising period thereof.

The active inductor 580 may selectively perform an emphasis operation or a de-emphasis operation for the output data DOUT by outputting an inductor control signal Cons_S in response to the inductor activating voltage Vidt. The emphasis operation may be performed to increase strength of the output data DOUT, and the de-emphasis operation may be performed to reduce strength of the output data DOUT. In this embodiment, by controlling the output of the inductor activating voltage Vidt, the de-emphasis operation may be performed during a falling period of the output data DOUT and the emphasis operation may be performed during a rising period of the output data DOUT.

Figure 4:
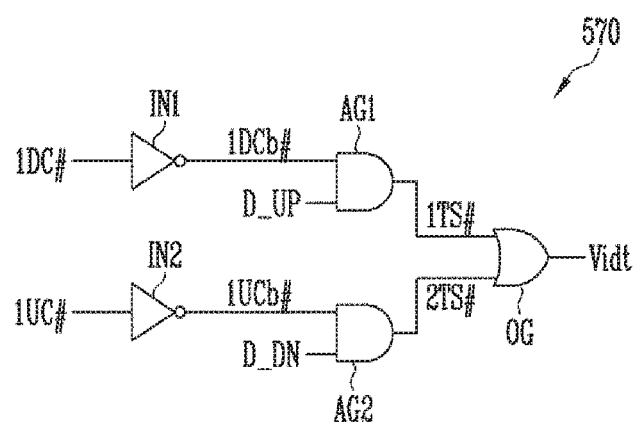
FIG. 4 is a circuit diagram illustrating an active inductor controller in accordance with an embodiment.

FIG. 4 is a circuit diagram illustrating an active inductor controller, e.g., the active inductor controller 570 of FIG. 3, in accordance with an embodiment.

Referring to FIG. 4, the active inductor controller 570 may selectively output the inductor activating voltage Vidt in response to the first pull-up code 1UC #, the first pull-down code 1DC #, the pull-up pulse D_UP, and the pull-down pulse D_DN. For example, the active inductor controller 570 may output the inductor activating voltage Vidt during a falling period of the data DATA and may not output the inductor activating voltage Vidt during a rising period thereof.

The active inductor controller 570 may include first and second inverters IN1 and IN2, first and second AND gates AG1 and AG2, and an OR gate OG. The first inverter IN1 may invert the first pull-down code 1DC # to output a first inverted pull-down code 1DCb #. The second inverter IN2 may invert the first pull-up code 1UC # to output a first inverted pull-up code 1UCb #. The first AND gate AG1 may output a first detection signal 1TS # in response to the first inverted pull-down code 1DCb # and the pull-up pulse D_UP. The second AND gate AG2 may output a second detection signal 2TS # in response to the first inverted pull-up code 1UCb # and the pull-down pulse D_DN. The OR gate OG may output the inductor activating voltage Vidt in response to the first and second detection signals 1TS # and 2TS #.

Operations of the above-described circuits are described below.

Since the first inverter IN1 outputs the first inverted pull-down code 1DCb # by inverting the first pull-down code 1DC #, the first inverted pull-down code 1DCb # may have the same level as the pull-up pulse D_UP. Since the first pull-down code 1DC # is output from the first pull-down pre-driver 520 as shown in FIG. 3 in response to the pull-up pulse D_UP, there may be time delay between the first pull-down code 1DC # and the pull-up pulse D_UP. Therefore, when there is no time delay in a circuit, the first inverted pull-down code 1DCb # and the pull-up pulse D_UP may be the same signal. However, a time delay difference may be caused due to physical and electrical characteristics of the circuit. Therefore, the first inverted pull-down code 1DCb # may be the same as the pull-up pulse D_UP after a slight time delay. A truth table of the first AND gate AG1 that outputs the first detection signal 1TS # in response to the first inverted pull-down code 1DCb # and the pull-up pulse D_UP is shown as in Table 1 below.

TABLE 1

| 1DCb# | D_UP | 1TS# |
|---|---|---|
| 0 | 0 | 0 |
| 0 | 1 | 0 |
| 1 | 0 | 0 |
| 1 | 1 | 1 |

Referring to Table 1, the first AND gate AG1 may output the first detection signal 1TS # having a logic high level, e.g., '1', when both the first inverted pull-down code 1DCb # and the pull-up pulse D_UP have the logic high level '1'. Otherwise, the first AND gate AG1 may output the first detection signal 1TS # having a logic low level, e.g., '0'.

The second AND gate AG2 may have the same configuration as the first AND gate AG1 except for input signals and output signals. Thus, a truth table of the second AND gate AG2 is shown as in Table 2 below.

TABLE 2

| 1UCb# | D_DN | 2TS# |
|---|---|---|
| 0 | 0 | 0 |
| 0 | 1 | 0 |
| 1 | 0 | 0 |
| 1 | 1 | 1 |

Referring to Table 2, the second AND gate AG2 may output the second detection signal 2TS # having a logic high level '1' when both the first inverted pull-up code 1UCb # and the pull-down pulse D_DN have the logic high level '1'. Otherwise, the second AND gate AG2 may output the second detection signal 2TS # having a logic low level '0'.

The OR gate OG may output the inductor activating voltage Vidt in response to the first and second detection signals 1TS # and 2TS #. Thus, a truth table of the OR gate OG is shown as in Table 3 below.

TABLE 3

| 1TS# | 2TS# | Vidt |
|---|---|---|
| 0 | 0 | 0 |
| 0 | 1 | 1 |
| 1 | 0 | 1 |
| 1 | 1 | 1 |

Referring to Table 3, the OR gate OG may output the inductor activating voltage Vidt when at least one of the first and second detection signals 1TS # and 2TS # has a logic high level, e.g., '1'. The OR gate OG may not output the inductor activating voltage Vidt when the first and second detection signals 1TS # and 2TS # have a logic low level, e.g., '0'.

Figure 5:
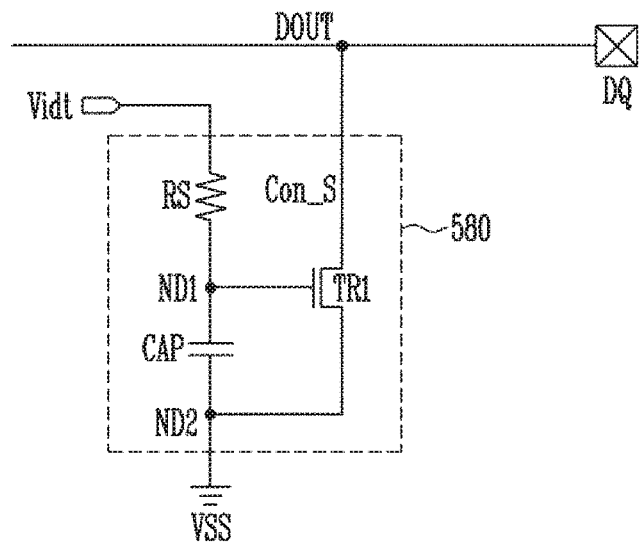
FIG. 5 is a diagram illustrating an active inductor in accordance with an embodiment.

FIG. 5 is a diagram illustrating an active inductor in accordance with an embodiment, for example, the active inductor 580 of FIG. 3.

Referring to FIG. 5, the active inductor 580 may output an inductor control signal Con_S so that an emphasis operation or a de-emphasis operation may be performed on the output data DOUT in response to the inductor activating voltage Vidt. More specifically, the emphasis operation may be performed by the pull-up main driver 550, not by the active inductor 580. In other words, the inductor control signal Con_S may not be output when the active inductor 580 is deactivated, so that the emphasis operation may be performed. When the active inductor 580 is activated, the inductor control signal Con_S may be output at a low level, so that a de-emphasis operation may be performed. For example, when the 15 inductor activating voltage Vidt is applied to the active inductor 580, the active inductor 580 may be activated. When the inductor activating voltage Vidt is not applied to the active inductor 580, the active inductor 580 may be deactivated.

The active inductor 580 may be configured as described below.

The active inductor 580 may include elements such as a resistor RS, a capacitor CAP, and a first switching transistor TR1. Together, the elements may function as an inductor.

The resistor RS may be coupled between a terminal to which the inductor activating voltage Vidt is applied and a first node ND1. The capacitor CAP may be coupled between the first node ND1 and a second node ND2. The second node ND2 may be coupled to a ground terminal for a ground voltage VSS. A first switching transistor TR1 may be implemented with an NMOS transistor. The first switching transistor TR1 may be coupled between an input/output pad DQ and the second node ND2. The first switching transistor TR1 may be turned or off in response to a voltage of the first node ND1.

Figure 6:
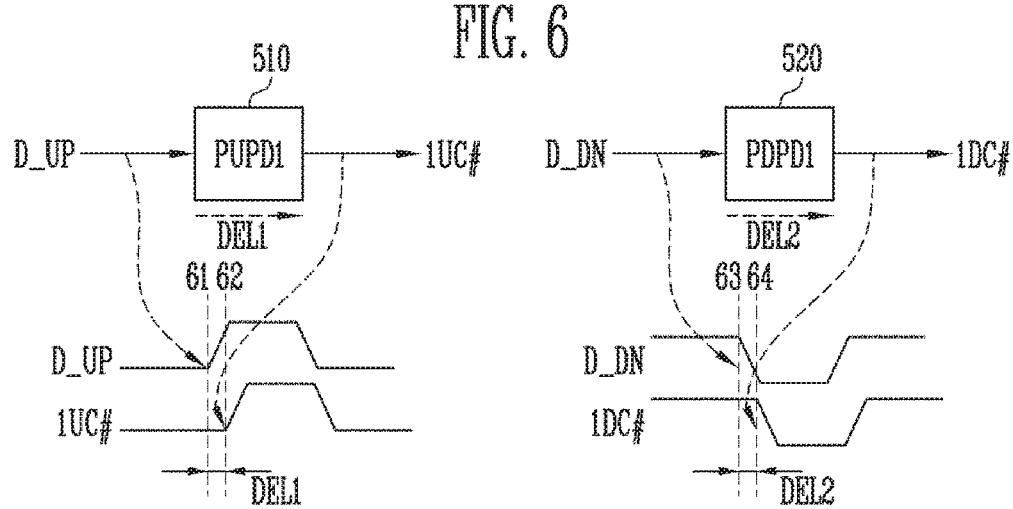
FIG. 6 is a diagram illustrating delay of data in pre-drivers.

FIG. 6 is a diagram illustrating delay of data in pre-drivers.

Referring to FIG. 6, the first pull-up pre-driver 510 may output the first pull-up code 1UC # in response to the pull-up pulse D_UP. The first pull-down pre-driver 520 may output the first pull-down code 1DC # in response to the pull-down pulse D_DN.

Due to physical and electrical characteristics of circuits, the first pull-up pre-driver 510 may not immediately output the first pull-up code 1UC # at a time 61 when the pull-up pulse D_UP is applied. Thus, the first pull-up pre-driver 510 may output the first pull-up code 1UC # at a time 62 after a first delay time DEL1 from the time 61.

Similarly, to the first pull-up pre-driver 510, due to physical and electrical characteristics of circuits, the first pull-down pre-driver 520 may not immediately output the first pull-down code 1DC # at a time 63 when the pull-down pulse D_DN is applied. Therefore, the first pull-down pre-driver 520 may output the first pull-down code 1DC # at a time 64 after a second delay time DEL2 from the time 63.

Figure 7:
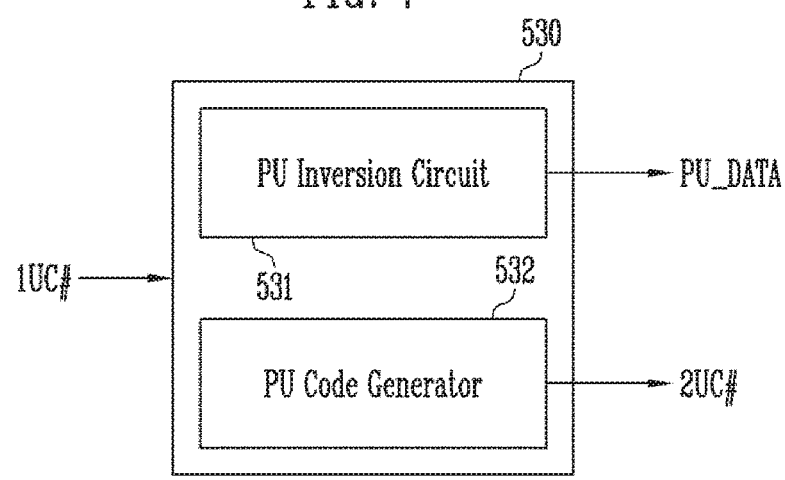
FIG. 7 is a diagram illustrating a second pull-up pre-driver in accordance with an embodiment.

FIG. 7 is a diagram illustrating a second pull-up pre-driver in accordance with an embodiment, for example, the second pull-up pre-driver 530 shown in FIG. 3.

Referring to FIG. 7, the second pull-up pre-driver 530 may include a pull-up (PU) inversion circuit 531 and a pull-up (PU) code generator 532.

The pull-up inversion circuit 531 may invert the pull-up signal included in the first pull-up code 1UC # to output the pull-up data PU_DATA. For example, the pull-up inversion circuit 531 may output the pull-up data PU_DATA having a low level when receiving the pull-up signal having a high level and may output the pull-up data PU_DATA having a high level when receiving the pull-up signal having a low level.

The pull-up code generator 532 may output the second pull-up code 2UC # according to the calibration code included in the first pull-up code 1UC #. The second pull-up code 2UC # may compensate for the pull-up data PU_DATA. For example, the pull-up code generator 532 may output the second pull-up code 2UC # for increasing a swing width of the calibration code included in the first pull-up code 1UC # when the swing width is less than a reference width. The pull-up code generator 532 may output the second pull-up code 2UC # for decreasing the swing width of the calibration code included in the first pull-up code 1UC # when the swing width is greater than the reference width. In addition, the pull-up code generator 532 may control the number of bits having a logic low level '0' and the number of bits having a logic high level '1' 10 included in the second pull-up code 2UC # according to a difference between the reference width and the swing width of the calibration code included in the first pull-up code 1UC #. In other words, the pull-up code generator 532 may output the second pull-up code 2UC # by combining '0' and '1' bits according to the calibration code included in the first pull-up code 1UC #.

Figure 8:
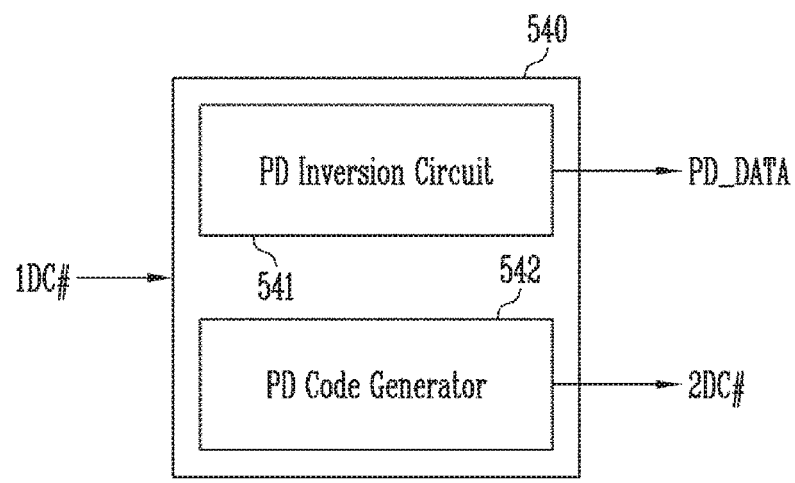
FIG. 8 is a diagram illustrating a second pull-down pre-driver in accordance with an embodiment.

FIG. 8 is a diagram illustrating a second pull-down pre-driver, e.g., the second pull-down pre-driver 540 shown in FIG. 3, in accordance with an embodiment.

Referring to FIG. 8, the second pull-down pre-driver 540 may include a pull-down (PD) inversion circuit 541 and a pull-down (PD) code generator 542.

The pull-down inversion circuit 541 may invert the pull-down signal included in the first pull-down code 1DC # to output the pull-down data PD_DATA. For example, the pull-down inversion circuit 541 may output the pull-down data PD_DATA having a low level when receiving the pull-down signal having a high level and may output the pull-down data PD_DATA having a high level when receiving the pull-down signal having a low level.

The pull-down code generator 542 may output the second pull-down code 2DC # according to the calibration code included in the first pull-down code 1DC #. The second pull-down code 2DC # may compensate for the pull-down data PD_DATA. For example, the pull-down code generator 542 may output the second pull-down code 2DC # for increasing a swing width of the calibration code included in the first pull-down code 1DC # when the swing width is less than a reference width. The pull-down code generator 542 may output the second pull-down code 2DC # for decreasing the swing width of the calibration code included in the first pull-down code 1DC # when the swing width is greater than the reference width. In addition, the pull-down code generator 542 may control the number of bits having a logic low level '0' and the number of bits having a logic high level '1' included in the second pull-down code 2DC # according to a difference between the reference width and the swing width of the calibration code included in the first pull-down code 1DC #. In other words, the pull-down code generator 542 may output the second pull-down code 2DC # by combining '0' and '1' bits according to the calibration code included in the first pull-down code 1DC #.

Figure 9:
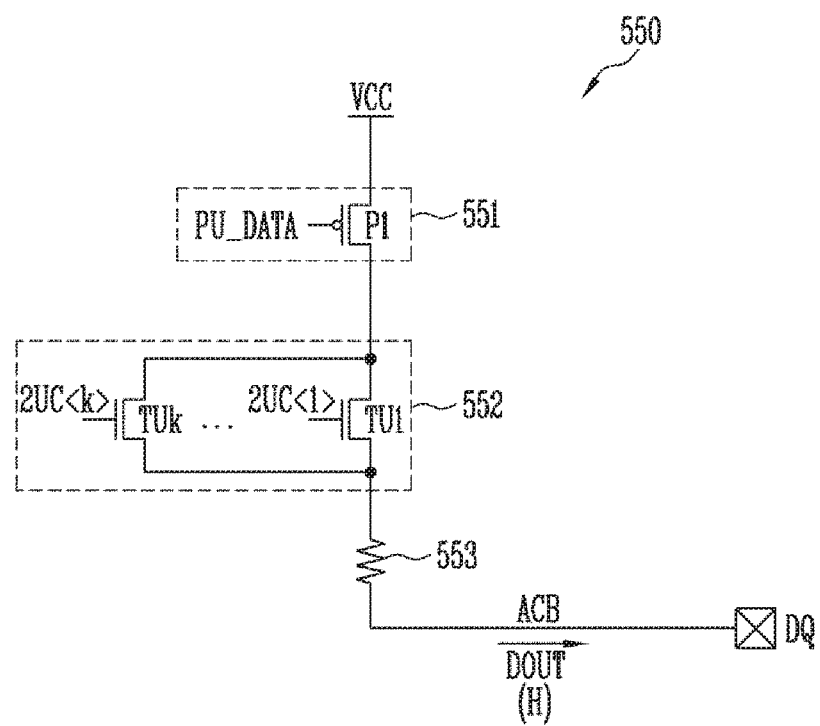
FIG. 9 is a diagram illustrating a pull-up main driver in accordance with an embodiment.

FIG. 9 is a diagram illustrating a pull-up main driver, e.g., the pull-up main driver 550 of FIG. 3 in accordance with an embodiment.

Referring to FIG. 9, the pull-up main driver 550 may include a main pull-up circuit 551 and a sub pull-up circuit 552. The main pull-up circuit 551 and the sub pull-up circuit 552 may be coupled in series between a terminal for a power supply voltage VCC and the input/output pad DQ. The main pull-up circuit 551 may be coupled between the power supply terminal and the sub pull-up circuit 552. The sub pull-up circuit 552 may be coupled between the main pull-up circuit 551 and the 15 input/output pad DQ. A resistor 553 may be further coupled between the sub pull-up circuit 552 and the input/output pad DQ.

The main pull-up circuit 551 may be implemented with a PMOS transistor P1. The PMOS transistor P1 may be turned on or off according to the pull-up data PU_DATA. For example, the PMOS transistor P1 may be turned on when the pull-up data PU_DATA having a low level is received, and may be turned off when the pull-up data PU_DATA having a high level is received.

The sub pull-up circuit 552 may include a plurality of NMOS transistors TU1 to TUk, where k is a positive integer. The NMOS transistors TU1 to TUk may be coupled in parallel between the main pull-up circuit 551 and the input/output pad DQ. Each of the NMOS transistors TU1 to TUk may be turned on or off in response to each of second pull-up codes 2UC <1> to 2UC <k>. In terms of the same gate voltage level, the amount of current flowing through an NMOS transistor may be greater than the amount of current flowing through a PMOS transistor. Therefore, when the sub pull-up circuit 552 includes the NMOS transistors TU1 to TUk, the current amount may increase while a gate voltage by which the sub pull-up circuit 552 is operated decreases. Accordingly, alternating current-boosting (ACB) may occur in the input/output pad DQ. In other words, when the output data DOUT having a logic high level (H) is output, the AC-boosting (ACB) may occur, so that an emphasis operation may be performed.

Figure 10:
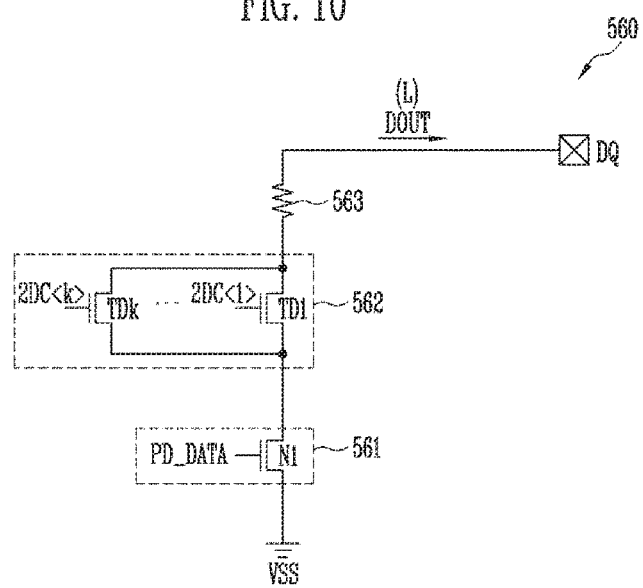
FIG. 10 is a diagram illustrating a pull-down main driver in accordance with an embodiment.

FIG. 10 is a diagram illustrating a pull-down main driver, e.g., the pull-down main driver 560 of FIG. 3, in accordance with an embodiment.

Referring to FIG. 10, the pull-down main driver 560 may output the output data DOUT having a logic low level (L) in response to the pull-down data PD_DATA and second pull-down codes 2DC <1> to 2DC <k>. The pull-down main driver 560 may include a main pull-down circuit 561 and a sub pull-down circuit 562. The main pull-down circuit 561 and the sub pull-down circuit 562 may be coupled in series between the input/output pad DQ and a terminal for a ground voltage VSS. The main pull-down circuit 561 may be coupled between the sub pull-down circuit 562 and the ground terminal. The sub pull-down circuit 562 may be coupled between the input/output pad DQ and the main pull-down circuit 561. A resistor 563 may be further coupled between the sub pull-down circuit 562 and the 10 input/output pad DQ.

The main pull-down circuit 561 may be implemented with an NMOS transistor N1. The NMOS transistor N1 may be turned on or off according to the pull-down data PD_DATA. For example, the NMOS transistor N1 may be turned on when the pull-down data PD_DATA having a low level is received, and may be turned off when the pull-down data PD_DATA having a high level is received.

The sub pull-down circuit 562 may include a plurality of NMOS transistors TD1 to TDk, where k is a positive integer. The NMOS transistors TD1 to TDk may be coupled in parallel between the input/output pad DQ and the main pull-down circuit 561. Each of the NMOS transistors TD1 to TDk may be turned on or off in response to each of the second pull-down codes 2DC <1> to 2DC <k>.

An emphasis operation and a de-emphasis operation of the input/output pad DQ by the above-described circuits are described below.

Figure 11:
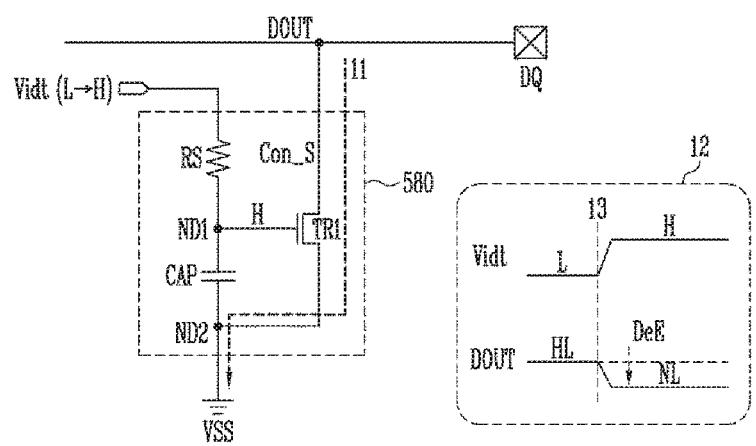
FIG. 11 is a diagram illustrating a de-emphasis operation of a data output buffer in accordance with an embodiment.

FIG. 11 is a diagram illustrating a de-emphasis operation of a data output buffer in accordance with an embodiment.

Referring to FIG. 11, the data output buffer may perform a de-emphasis operation by the active inductor 580 when outputting the output data DOUT having a logic low level (L). To perform the de-emphasis operation, the active inductor 580 may be activated. To activate the active inductor 580, the inductor activating voltage Vidt may be a logic high level (H). For example, when the inductor activating voltage Vidt transitions from a logic low level (L) to a logic high level (H), since a potential of the first node ND1 may become logic high level (H), the NMOS switching transistor TR1 may be turned on. When the first switching transistor TR1 is turned on, a current path I1 may be formed between the input/output pad DQ and the ground terminal, so that a de-emphasis operation DeE may be performed. As a result, as shown in 12, the output data DOUT may decrease from a high level HL to a normal level NL. The normal level NL may be less than the high level HL by the de-emphasis operation DeE. Reference numeral 13 indicates the start of the transition from HL to NL of DOUT, as well as the start of the transition from L to H of Vidt.

Figure 12:
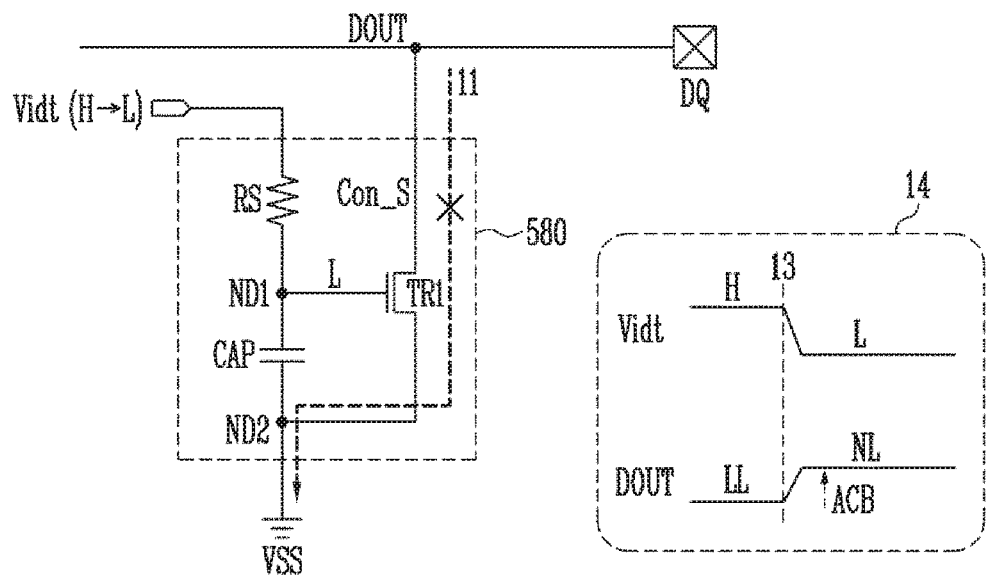
FIG. 12 is a diagram illustrating an emphasis operation of a data output buffer in accordance with an embodiment.

FIG. 12 is a diagram illustrating an emphasis operation of a data output buffer in accordance with an embodiment.

Referring to FIG. 12, the data output buffer may perform an emphasis operation by the pull-up main driver 550 of FIG. 3 when outputting the output data DOUT having a logic high level (H). To perform the emphasis operation, the active 10 inductor 580 may be deactivated. To deactivate the active inductor 580, the inductor activating voltage Vidt may be a logic low level (L). For example, when the inductor activating voltage Vidt transitions from a logic high level (H) to a logic low level (L), since a potential of the first node ND1 may become a logic low level (L), the switching transistor TR1 as an NMOS transistor may be turned off. When the first switching transistor TR1 is turned off, the current path I1 may be blocked between the input/output pad DQ and the ground terminal. An emphasis operation may be performed by the pull-up main driver 550, so that AC-boosting (ACB) may be generated and the output data DOUT may increase from a low level (LL) to a normal level (NL), as shown in 14. The normal level (NL) may be greater than the low level (LL) by the emphasis operation. Here, reference numeral 13 indicates the start of the transition from LL to NL of DOUT, as well as the start of the transition from H to L of Vidt.

Figure 13:
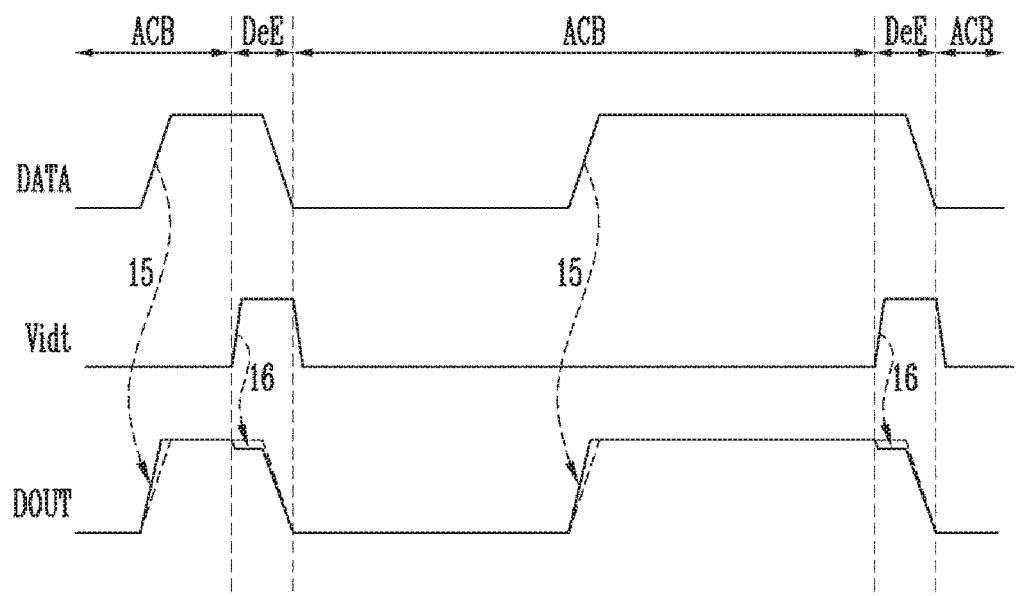
FIG. 13 is a diagram illustrating output data to which emphasis and de-emphasis are applied in accordance with an embodiment.

FIG. 13 is a diagram illustrating output data to which emphasis and de-emphasis are applied in accordance with an embodiment.

Referring to FIG. 13, the de-emphasis operation DeE may be selectively performed only during a falling period of the data DATA, while an emphasis operation may be performed during any or all other periods thereof to cause AC-boosting (ACB).

For example, when the data DATA (e.g., data read during a read operation for a memory device) transitions from a logic low level to a logic high level (15), the inductor activating voltage Vidt may be maintained in a low state so that AC-boosting (ACB) may be maintained. When the inductor activating voltage Vidt is low, the active inductor 580 may be deactivated, so that an emphasis operation may be performed by the pull-up main driver 550. Therefore, the output data DOUT may be transitioned to a high level.

When the read data DATA transitions from a logic high level to a logic low level (16), the inductor activating voltage Vidt may increase to a high level so that the de-emphasis operation DeE may be performed. As a result, the active inductor 580 may be activated, so that the de-emphasis operation DeE may be performed for the output data DOUT on the input/output pad DQ. For example, since the inductor activating voltage Vidt varies according to a state of the data DATA, the inductor activating voltage Vidt may increase to a high level before the output data DOUT transitions from a logic high level to a logic low level. Therefore, the output data DOUT may slightly decrease from the high level by the de-emphasis operation DeE and decrease to a low level according to the data DATA. When the data DATA decreases to a low level, the inductor activating voltage Vidt may be maintained to be low.

As for the next read data DATA, AC-boosting (ACB) may occur during a rising period (15) of the data DATA, and the de-emphasis operation DeE may be performed during a falling period (16).

As described above, during an output operation of the data DATA, by selectively applying an emphasis operation and a de-emphasis operation, the data DATA may fully swing between a high level and a low level.

Figure 14:
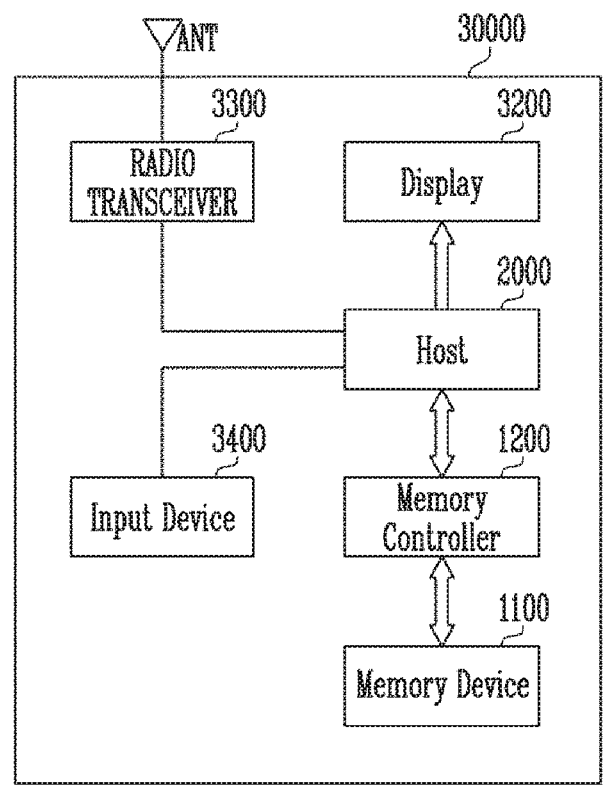
FIG. 14 is a diagram illustrating a memory system including a memory device according to an embodiment.

FIG. 14 is a diagram illustrating a memory system 30000 including a memory device, e.g., the memory device 1100 shown in FIG. 1, in accordance with an embodiment.

Referring to FIG. 14, the memory system 30000 may be embodied into a cellular phone, a smart phone, a tablet personal computer (PC), a personal digital assistant (PDA), or a wireless communication device.

The memory system 30000 may include the memory device 1100 and the memory controller 1200 controlling the operations of the memory device 1100. The memory controller 1200 may control a data access operation of the memory device 1100, for example, a program operation, an erase operation or a read operation of the memory device 100 in response to control of the host 2000.

The memory controller 1200 may control data programmed into the memory device 1100 to be output through a display 3200 in response to control of the memory controller 1200.

A radio transceiver 3300 may exchange a radio signal through an antenna ANT. For example, the radio transceiver 3300 may change the radio signal received through the antenna ANT into a signal which can be processed by the host 2000. Therefore, the host 2000 may process the signal output from the radio transceiver 3300 and transfer the processed signal to the memory controller 1200 or the display 3200. The memory controller 1200 may transfer the signal processed by the host 2000 to the memory device 1100. In addition, the radio transceiver 3300 may convert a signal output from the host into a radio signal and output the radio signal to an external device through the antenna ANT. A control signal for controlling the operations of the host or data to be processed by the host 2000 may be input by an input device 3400, which may include a pointing device, such as a touch pad and a computer mouse, a keypad, or a keyboard. The host 2000 may control the operations of the display 3200 so that data output from the memory controller 1200, from the radio transceiver 3300, or from an input device 3400 may be output through the display 3200.

Figure 15:
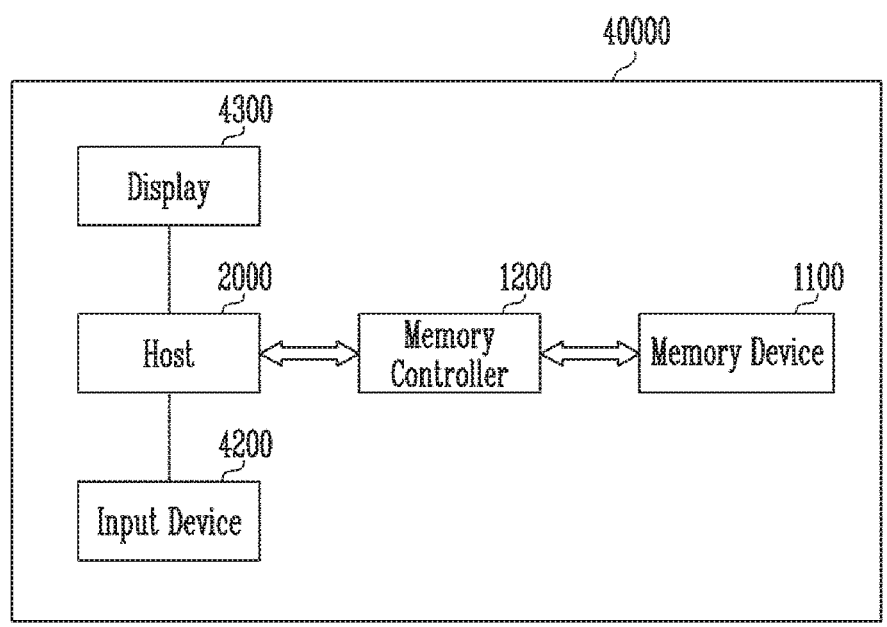
FIG. 15 is a diagram illustrating a memory system including a memory device according to an embodiment.

FIG. 15 is a diagram illustrating a memory system 40000 including a memory device, e.g., the memory device 1100 shown in FIG. 1, in accordance with an embodiment.

Referring to FIG. 15, the memory system 40000 may be embodied in a personal computer (PC), a tablet PC, a net-book, an e-reader, a personal digital assistant (PDA), a portable multimedia player (PMP), an MP3 player, or an MP4 player.

The memory system 40000 may include the memory device 1100 and the memory controller 1200 controlling a data processing operation of the memory device 1100.

The host 2000 may output data stored in the memory device 1100 through a display 4300 according to data input through an input device 4200. Examples of the input device 4200 include a pointing device such as a touch pad or a computer mouse, a keypad, or a keyboard.

The host 2000 may control the overall operations of the memory system 40000 and operations of the memory controller 1200.

Figure 16:
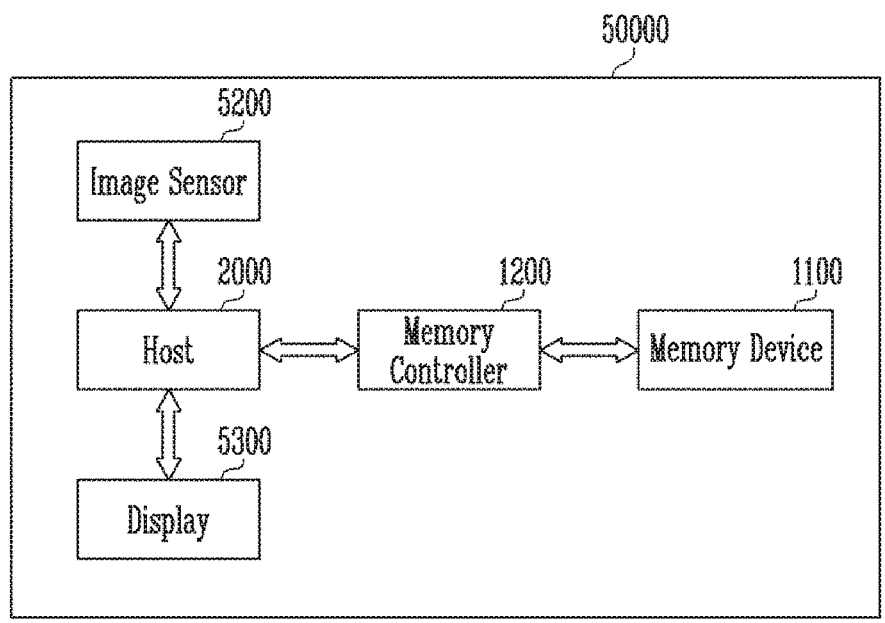
FIG. 16 is a diagram illustrating a memory system 15 including a memory device according to an embodiment.

FIG. 16 is a diagram illustrating a memory system 50000 including a memory device, e.g., the memory device 1100 shown in FIG. 1, in accordance with an embodiment.

Referring to FIG. 16, the memory system 50000 may be embodied in an image processing device, for example, a digital camera, a mobile phone attached with a digital camera, a smart phone attached with a digital camera, or a tablet personal computer (PC) attached with a digital camera.

The memory system 50000 may include the memory device 1100 and the memory controller 1200 controlling a data processing operation of the memory device 1100, for example, a program operation, an erase operation or a read operation.

An image sensor 5200 of the memory system 50000 may convert an optical image into digital signals, and the converted digital signals may be transferred to the host. In response to control of the host, the converted digital signals may be output through the display 5300 or stored in the memory device 1100 through the memory controller 1200. In addition, the data stored in the memory device 1100 may be output through a display 5300 according to control of the host.

Figure 17:
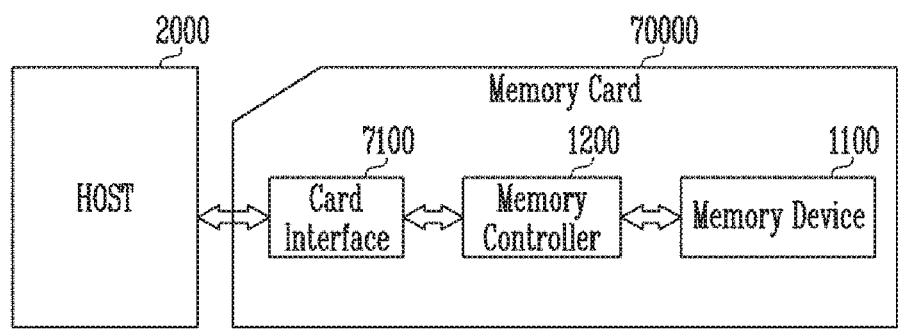
FIG. 17 is a diagram illustrating a memory system including a memory device according to an embodiment.

FIG. 17 is a diagram illustrating a system 70000 including a memory device, e.g., the memory device 1100 in FIG. 1, in accordance with an embodiment.

Referring to FIG. 17, the system may include a host 2000 and a memory card 70000.

The memory card 70000 may be embodied into a smart card. The memory card 70000 may include the memory device 1100, the memory controller 1200 and a card interface 7100.

The memory controller 1200 may control data exchange between the memory device 1100 and the card interface 7100. The card interface 7100 may be, but is not limited to, a secure digital (SD) card interface or a multi-media card (MMC) interface. In addition, the card interface 7100 may interface data exchange between the host 2000 and the memory controller 1200 according to a protocol of the host 2000. In accordance with an embodiment, the card interface 7100 may support a universal serial bus (USB) protocol and an interchip (IC)-USB protocol. The card interface 7100 may refer to hardware that supports a protocol used by the host 2000, software mounted on the hardware, or a signal transmission method.

In accordance with embodiments of the present disclosure, a data output buffer may selectively perform an emphasis function and a de-emphasis function to output data by selectively driving an active inductor according to data.

It will be apparent to those skilled in the art, in light of the present disclosure, that various modifications can be made to the above-described embodiments of the present invention without departing from the spirit or scope of the invention. Thus, it is intended that the present invention cover all such modifications that fall within the scope of the appended claims and their equivalents.

What is claimed is:

1. A data output buffer, comprising:
    a pull-up main driver outputting output data having a high level through an output pad by performing an emphasis operation according to input data;
    a pull-down main driver outputting the output data having a low level through the output terminal according to the input data;
    an active inductor controller selectively activating an inductor activating voltage by detecting a rising or falling period of the input data;
    an active inductor selectively performing a de-emphasis operation on the output terminal in response to the inductor activating voltage;
    a trigger controller outputting a pull-up pulse and a pull-down pulse according to the input data;
    a first pull-up pre-driver outputting a first pull-up code by calibrating the pull-up pulse;
    a first pull-down pre-driver outputting a first pull-down code by calibrating the pull-down pulse;
    a second pull-up pre-driver outputting pull-up data determining a high level of the output data in response to the first pull-up code and outputting a second pull-up code as a calibration code; and
    a second pull-down pre-driver outputting pull-down data for determining a low level of the output data in response to the first pull-down code and outputting a second pull-down code as a calibration code.

2. The data output buffer of claim 1, wherein the trigger controller outputs the pull-up pulse having a high level according to the data and outputs the pull-down pulse having a low level according to the input data.

3. The data output buffer of claim 1, wherein the first pull-up pre-driver outputs the first pull-up code including a plurality of bits by calibrating the pull-up pulse, the first pull-up code including a pull-up signal having a same level as the pull-up pulse.

4. The data output buffer of claim 3, wherein the second pull-up pre-driver comprises:
    a pull-up inversion circuit inverting the pull-up signal included in the first pull-up code to output the pull-up data; and
    a pull-up code generator outputting the pull-up code by calibrating a calibration code included in the first pull-up code.

5. The data output buffer of claim 1, wherein the first pull-down pre-driver outputs the first pull-down code including a plurality of bits by calibrating the pull-down pulse, the first pull-down code including a pull-down signal having a same level as the pull-down pulse.

6. The data output buffer of claim 5, wherein the second pull-down pre-driver comprises:
    a pull-down inversion circuit inverting the pull-down signal included in the first pull-down code to output the pull-down data; and
    a pull-down code generator outputting the pull-down code by calibrating the calibration code included in the first pull-down code.

7. The data output buffer of claim 1, wherein the pull-up main driver comprises:
    a main pull-up circuit selectively forming a current path in response to the pull-up data; and
    a sub pull-up circuit selectively forming a current path in response to the second pull-up code and performing the emphasis operation for the output data.

8. The data output buffer of claim 7, wherein the main pull-up circuit includes a PMOS transistor turned on or off in response to the pull-up data.

9. The data output buffer of claim 7, wherein the sub pull-up circuit comprises a plurality of NMOS transistors each operating in response to the second pull-up code and coupled in parallel between the main pull-up circuit and the output terminal.

10. The data output buffer of claim 1, wherein the pull-down main driver comprises:
    a main pull-down circuit selectively forming a current path in response to the pull-down data; and
    a sub pull-down circuit selectively forming a current path in response to the second pull-down code.

11. The data output buffer of claim 10, wherein the main pull-down circuit includes an NMOS transistor turned on or off in response to the pull-down data.

12. The data output buffer of claim 10, wherein the sub pull-down circuit comprises a plurality of NMOS transistors each operating in response to the second pull-down code and coupled in parallel between the main pull-down circuit and the output terminal.

13. The data output buffer of claim 1, wherein the active inductor controller outputs the inductor activating voltage in response to the first pull-up code, the first pull-down code, the pull-up pulse, and the pull-down pulse.

14. The data output buffer of claim 13, wherein the active inductor controller comprises:
    a first inverter inverting the first pull-down code to output a first inversion pull-down code;
    a second inverter inverting the first pull-up code to output a first inversion pull-up code;
    a first AND gate outputting a first detection signal in response to the first inversion pull-down code and the pull-up pulse;
    a second AND gate outputting a second detection signal in response to the first inversion pull-up code and the pull-down pulse; and
    an OR gate outputting the inductor activating voltage in response to the first and second detection signals.

15. The data output buffer of claim 1, wherein the active inductor decreases a potential of the output terminal by performing the de-emphasis operation when the inductor activating voltage is applied.

16. The data output buffer of claim 15, wherein the active inductor comprises:
    a resistor coupled between a first node and a terminal to which the inductor activating voltage is applied;

a capacitor coupled between the first node and a ground terminal; and an NMOS transistor coupling the output terminal to, or decoupling the output terminal from, the ground terminal in response to a voltage of the first node.

17. A data output buffer, comprising:

a pull-up pre-driver outputting a pull-up code by calibrating a pull-up pulse;

a pull-down pre-driver outputting a pull-down code by calibrating a pull-down pulse;

an active inductor controller selectively outputting an inductor activating voltage by detecting the pull-up code and the pull-down pulse and detecting the pull-down code and the pull-up pulse; and an active inductor selectively performing a de-emphasis operation to reduce a potential of an output terminal in response to the inductor activating voltage.

18. The data output buffer of claim 17, wherein the active inductor controller outputs the inductor activating voltage when an inverted pull-up code of the pull-up code and the pull-down pulse have a same pulse, or when an inverted pull-down code of the pull-down code and the pull-up pulse have a same pulse.

19. The data output buffer of claim 18, wherein the active inductor comprises:

a first inverter inverting the pull-down code to output the inverted pull-down code;

a second inverter inverting the pull-up code to output the inverted pull-up code;

a first AND gate outputting a first detection signal in response to the inverted pull-down code and the pull-up pulse;

a second AND gate outputting a second detection signal in response to the inverted pull-up code and the pull-down pulse; and an OR gate outputting the inductor activating voltage in response to the first and second detection signals.

* * * * *